US012787677B2

(12) United States Patent
Deye et al.

(10) Patent No.: US 12,787,677 B2
(45) Date of Patent: Nov. 3, 2026

(54) MATERIAL LAYER DEPOSITION METHODS, SEMICONDUCTOR PROCESSING SYSTEMS, AND RELATED COMPUTER PROGRAM PRODUCTS

(71) Applicant: ASM IP Holding, B.V., Almere (NL)

(72) Inventors: Gregory Deye, Phoenix, AZ (US); Arun Murali, Tempe, AZ (US); Frederick Aryeetey, Phoenix, AZ (US); Caleb Miskin, Mesa, AZ (US); Alexandros Demos, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 171 days.

(21) Appl. No.: 18/048,145

(22) Filed: Oct. 20, 2022

(65) Prior Publication Data

US 2023/0125884 A1 Apr. 27, 2023

Related U.S. Application Data

(60) Provisional application No. 63/270,770, filed on Oct. 22, 2021.

(51) Int. Cl.

| | |
|---|---|
| ***H10P 70/00*** | (2026.01) |
| ***B05D 1/36*** | (2006.01) |
| ***H10P 14/43*** | (2026.01) |
| ***H10P 72/00*** | (2026.01) |
| ***H10P 72/76*** | (2026.01) |

(52) U.S. Cl.

CPC .............. *H10P 70/125* (2026.01); *B05D 1/36* (2013.01); *H10P 14/432* (2026.01); *H10P 72/0432* (2026.01); *H10P 72/7612* (2026.01); *H10P 72/7618* (2026.01)

(58) Field of Classification Search

None

See application file for complete search history.

(56) References Cited

U.S. PATENT DOCUMENTS

| | | | | |
|---|---|---|---|---|
| 6,677,247 | B2 | 1/2004 | Yuan | |
| 6,774,000 | B2 | 8/2004 | Natzle | |
| 6,890,853 | B2 | 5/2005 | Biberger | |
| 6,949,450 | B2 | 9/2005 | Chiang | |
| 7,507,660 | B2 | 3/2009 | Chen | |
| 7,659,203 | B2 | 2/2010 | Stewart | |
| 8,110,489 | B2 | 2/2012 | Ganguli | |
| 2007/0042602 | A1 | 2/2007 | Watkins | |
| 2007/0181057 | A1* | 8/2007 | Lam | C23C 16/505 257/E21.252 |
| 2012/0266819 | A1* | 10/2012 | Sanchez | H01L 21/67115 118/729 |
| 2020/0013878 | A1* | 1/2020 | Colombeau | H01L 21/02603 |

(Continued)

*Primary Examiner* — Michael P. Rodriguez

(74) *Attorney, Agent, or Firm* — Banner & Witcoff, Ltd.

(57) ABSTRACT

A material layer deposition method includes supporting a substrate in a preclean module and exposing the substrate to a preclean etchant while supported within the preclean module. The substrate is transferred to a deposition module and exposed to an adsorbate while supported within the deposition module. A material layer is the deposited onto the substrate while supported within the deposition module subsequent to exposing the substrate to the adsorbate. Semiconductor processing systems and computer program products are also described.

20 Claims, 13 Drawing Sheets

(56) References Cited

U.S. PATENT DOCUMENTS

| | | | |
|---|---|---|---|
| 2020/0286909 | A1 | 9/2020 | Yuda et al. |
| 2020/0357631 | A1 | 11/2020 | Ueda |
| 2021/0070961 | A1 | 3/2021 | Nakayama |

* cited by examiner

MATERIAL LAYER DEPOSITION METHODS, SEMICONDUCTOR PROCESSING SYSTEMS, AND RELATED COMPUTER PROGRAM PRODUCTS

CROSS-REFERENCE TO RELATED APPLICATIONS

This application is a nonprovisional of, and claims priority to and the benefit of, U.S. Provisional Patent Application No. 63/270,770, filed on Oct. 22, 2021 and titled "Modes to Maintain Pristine Growth Surfaces for Epitaxial Film Deposition," the contents of which are hereby incorporated by reference herein.

FIELD OF INVENTION

The present disclosure generally relates to fabricating semiconductor devices, and more particularly, to depositing material layers onto substrates during the fabrication of semiconductor devices.

BACKGROUND OF THE DISCLOSURE

Semiconductor devices, such as integrated circuit and power electronic devices, are commonly fabricated using material layers deposited onto substrates. The material layers are generally deposited by loading the substrate into a deposition reactor, heating the substrate to a desired deposition temperature, and exposing the substrate to a material layer precursor such that a material layer deposited onto the substrate, such as using an epitaxial process. Once the material layer is deposited onto the substrate the substrate is typically removed from the deposition reactor and sent on for further processing, as appropriate for the semiconductor device being fabricated.

In some semiconductor devices, performance of the semiconductor device may be influenced by oxygen-containing species resident on the surface of the substrate at the start of the material layer deposition process. For example, oxygen-containing species resident on the surface of the substrate may influence surface roughness or otherwise disrupt epitaxial growth on the substrate surface, potentially altering the electrical properties otherwise desired in the material layer. Oxygen-containing species resident the surface of the substrate at the start of the deposition process may also become incorporated in the material layer as interfacial oxygen, potentially also altering electrical properties of the material layer. Such oxygen-containing species may become resident on the surface of the substrate by exposure of the substrate to oxygen within the atmosphere contained within the semiconductor processing system employed for the material deposition operation, for example, within a load lock and/or a substrate transfer chamber connected to the reactor employed for the material layer deposition operation.

Various countermeasures exist to limit oxygen-containing species resident on the substrate surface at the start of the material layer deposition process. For example, the substrate may undergo a pre-deposition etch operation, such as in a preclean module, to remove oxygen-containing species resident on the surface of the substrate. Alternatively (or additionally), the substrate may undergo a pre-deposition bake operation wherein the substrate is heated to remove oxygen-containing material that may be resident on the surface of the substrate. While generally satisfactory for their intended purpose, etched surfaces may acquire additional oxygen-containing species subsequent to precleaning, such as due to queuing within the semiconductor processing system, and pre-deposition bake operations may be limited in temperature and/or duration by the thermal budget associated with the semiconductor device being fabricated using the material layer subsequently deposited onto the substrate.

Such systems and methods have generally be satisfactory for their intended purpose. However, there remains a need for improved material layer deposition methods, semiconductor processing systems, and related computer program products. The present disclosure provides a solution to this need.

SUMMARY OF THE DISCLOSURE

A material layer deposition method is provided. The material layer deposition method includes supporting a substrate in a preclean module and exposing the substrate to a preclean etchant while supported within the preclean module. The substrate is transferred to a deposition module and exposed to an adsorbate while supported within the deposition module. A material layer is then deposited onto the substrate while supported within the deposition module subsequent to exposing the substrate to the adsorbate.

In addition to one or more of the features described above, or as an alternative, further examples may include that exposing the substrate to the preclean etchant includes exposing the substrate to a fluorine-containing material provided through a showerhead while the substrate is fixed relative to the showerhead. An oxygen-containing species may be removed from an upper surface of the substrate using the fluorine-containing material.

In addition to one or more of the features described above, or as an alternative, further examples may include that transferring the substrate further includes exposing the substrate to an atmosphere containing an oxygen-containing species prior to the supporting within the deposition module.

In addition to one or more of the features described above, or as an alternative, further examples may include that the oxygen-containing species may be communicated into the deposition module during transfer of the substrate into the deposition module.

In addition to one or more of the features described above, or as an alternative, further examples may include that exposing the substrate to the adsorbate includes exposing the substrate a dopant-containing material. The adsorbate may include at least one of an arsenic-containing material and a phosphorous-containing material.

In addition to one or more of the features described above, or as an alternative, further examples may include that the adsorbate may consist of or consist essentially of the at least one of arsenic-containing material and the phosphorous-containing material.

In addition to one or more of the features described above, or as an alternative, further examples may include that the adsorbate includes at least one of arsine ($AsH_3$) and phosphine ($PH_3$).

In addition to one or more of the features described above, or as an alternative, further examples may include that the adsorbate may consist of or consist essentially of the at least one of the arsine ($AsH_3$) and the phosphine ($PH_3$).

In addition to one or more of the features described above, or as an alternative, further examples may include that transferring the substrate from the preclean module to the deposition module includes surface attaching an oxygen-containing species onto an upper surface of the substrate. Exposing the substrate to the adsorbate may include displacing the surface attached oxygen-containing species from the upper surface of the substrate using the adsorbate.

In addition to one or more of the features described above, or as an alternative, further examples may include that transferring the substrate from the preclean module to the deposition module includes communicating an oxygen-containing species into an interior of the deposition module. Exposing the substrate to the adsorbate may include passivating an upper surface of the substrate using the adsorbate to prevent surface attachment of the oxygen-containing species to the upper surface of the substrate using the adsorbate.

In addition to one or more of the features described above, or as an alternative, further examples may include that supporting the substrate in the deposition module includes fixing the substrate relative to a deposition chamber body. Exposing the substrate to the adsorbate may include exposing the substrate to the adsorbate while the substrate is fixed relative to the deposition chamber body.

In addition to one or more of the features described above, or as an alternative, further examples may include that supporting the substrate in the deposition module includes fixing the substrate relative to a deposition chamber body. Exposing the substrate to the adsorbate may include exposing the substrate to the adsorbate while the substrate is fixed relative to the deposition chamber body.

In addition to one or more of the features described above, or as an alternative, further examples may include that supporting the substrate in the deposition module includes positioning the substrate on a plurality lift pins protruding above a substrate support supported for rotation about a rotation axis within the deposition chamber. Exposing the substrate to the adsorbate may include exposing the substrate to the adsorbate while the substrate is positioned on the plurality of lift pins, the substrate is positioned above the substrate support, and the substrate is fixed relative to the deposition chamber.

In addition to one or more of the features described above, or as an alternative, further examples may include that supporting the substrate within the deposition module includes seating the substrate on the substrate support by retracting the lift pins through the substrate support. Exposing the substrate to the adsorbate may include exposing the substrate to the adsorbate while the substrate is seated on the substrate support and rotatably fixed relative to the deposition chamber.

In addition to one or more of the features described above, or as an alternative, further examples may include that supporting the substrate in the deposition module includes rotating the substrate and the substrate about the rotation axis. Exposing the substrate to the adsorbate may include exposing the substrate to the adsorbate while the substrate is rotating about the rotation axis.

In addition to one or more of the features described above, or as an alternative, further examples may include that supporting the substrate in the deposition module includes heating the substrate to a predetermined material layer deposition temperature. Exposing the exposing the substrate to the adsorbate may include exposing the substrate to the adsorbate during the heating the substrate to the predetermined deposition temperature.

In addition to one or more of the features described above, or as an alternative, further examples may include that depositing the material layer onto the substrate further includes rotating the substrate about the rotation axis. Depositing the material layer onto the substrate includes may include exposing the substrate to additional adsorbate under conditions that cause the adsorbate to contribute a dopant to the material layer.

In addition to one or more of the features described above, or as an alternative, further examples may include that depositing the material layer includes comprises heating the substrate to a predetermined material layer deposition temperature, exposing the substrate to a silicon-containing material layer precursor, and exposing the substrate to additional adsorbate. The adsorbate may contributes a dopant to the material layer during deposition of the material layer onto the substrate.

In addition to one or more of the features described above, or as an alternative, further examples may include that the substrate is retained within the deposition module between the exposing the substrate to the adsorbate and the depositing the material layer onto the substrate.

A semiconductor processing system is provided. The semiconductor processing system includes a preclean module with a preclean etchant source and a transfer chamber connected to the preclean module and including a substrate transfer robot, the substrate transfer robot supported for movement within the transfer chamber relative to the preclean module. A deposition module including an adsorbate source and a material layer precursor source is connected to the deposition module. A controller is operatively connected to the preclean module, the substrate transfer robot, and the deposition module. The controller includes a processor disposed in communication with a memory and responsive to instructions recorded on the memory to support a substrate within the preclean module, expose the substrate to a preclean etchant provided by the preclean etchant source while supported within the preclean module, transfer the substrate to the deposition module using the substrate transfer robot, expose the substrate to an adsorbate provided by the adsorbate source while supported within the deposition module and deposit a material layer onto the substrate using the material layer precursor source while the substrate is supported within the deposition module. The material layer is deposited onto the substrate subsequent to exposing the substrate to the adsorbate and an oxygen-containing specie resident on the substrate is displaced by the adsorbate from the substrate prior deposition of the material layer to limit interfacial oxygen incorporated between the substrate and the material layer.

In addition to one or more of the features described above, or as an alternative, further examples may include that the substrate includes a pattern having a silicon surface portion and a dielectric surface portion. Exposing the substrate to the preclean etchant in the preclean module may include removing an oxide from the silicon surface portion of the pattern.

In addition to one or more of the features described above, or as an alternative, further examples may include that the substrate includes a pattern having a silicon surface portion and a dielectric surface portion. Transferring the substrate from the preclean module to the deposition module may include depositing an oxygen-containing species onto the silicon surface portion of the pattern.

In addition to one or more of the features described above, or as an alternative, further examples may include that the substrate includes a pattern having a silicon surface portion and a dielectric surface portion. Exposing the substrate to the adsorbate includes displacing an oxygen-containing species resident on the silicon surface portion of the substrate.

A computer program product is additionally provided. The computer program product includes a non-transitory machine-readable medium having a plurality of program modules recorded thereon with instructions that, when read by a processor, cause the processor to support a substrate in a preclean module of a semiconductor processing system. expose the substrate to a preclean etchant while supported within the preclean module, transfer the substrate to a deposition module of the semiconductor processing system through a transfer chamber of the semiconductor processing system. expose the substrate to an adsorbate within the deposition module, and deposit a material layer onto the substrate while supported within the deposition module subsequent to exposing the substrate to the adsorbate.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

Figure 9:
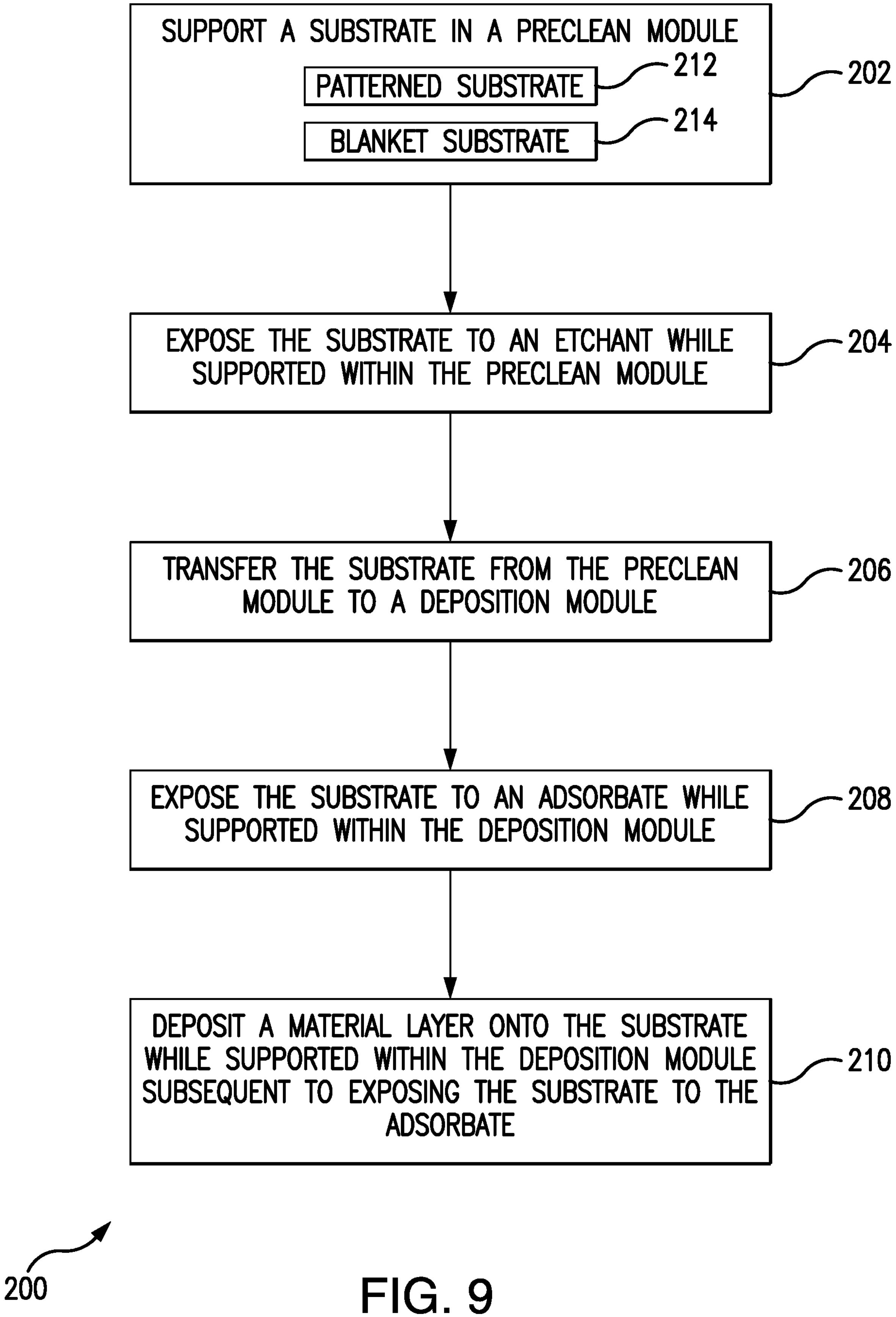
FIG. 9 is a block diagram of material layer deposition method of FIG. of a material layer deposition method according to the present disclosure, showing operations of the method according to an illustrative and non-limiting example of the method.
Figure 12:
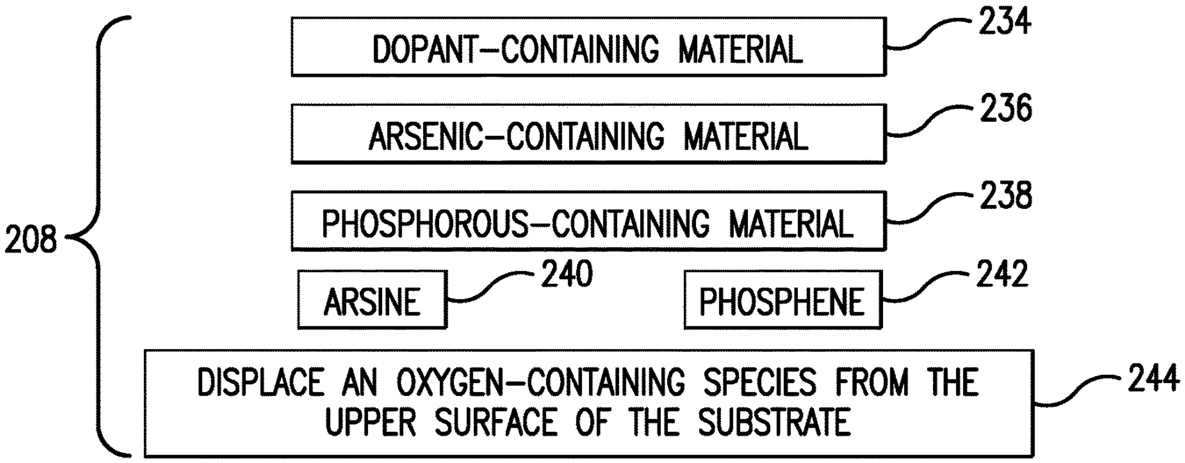
Figure 13:
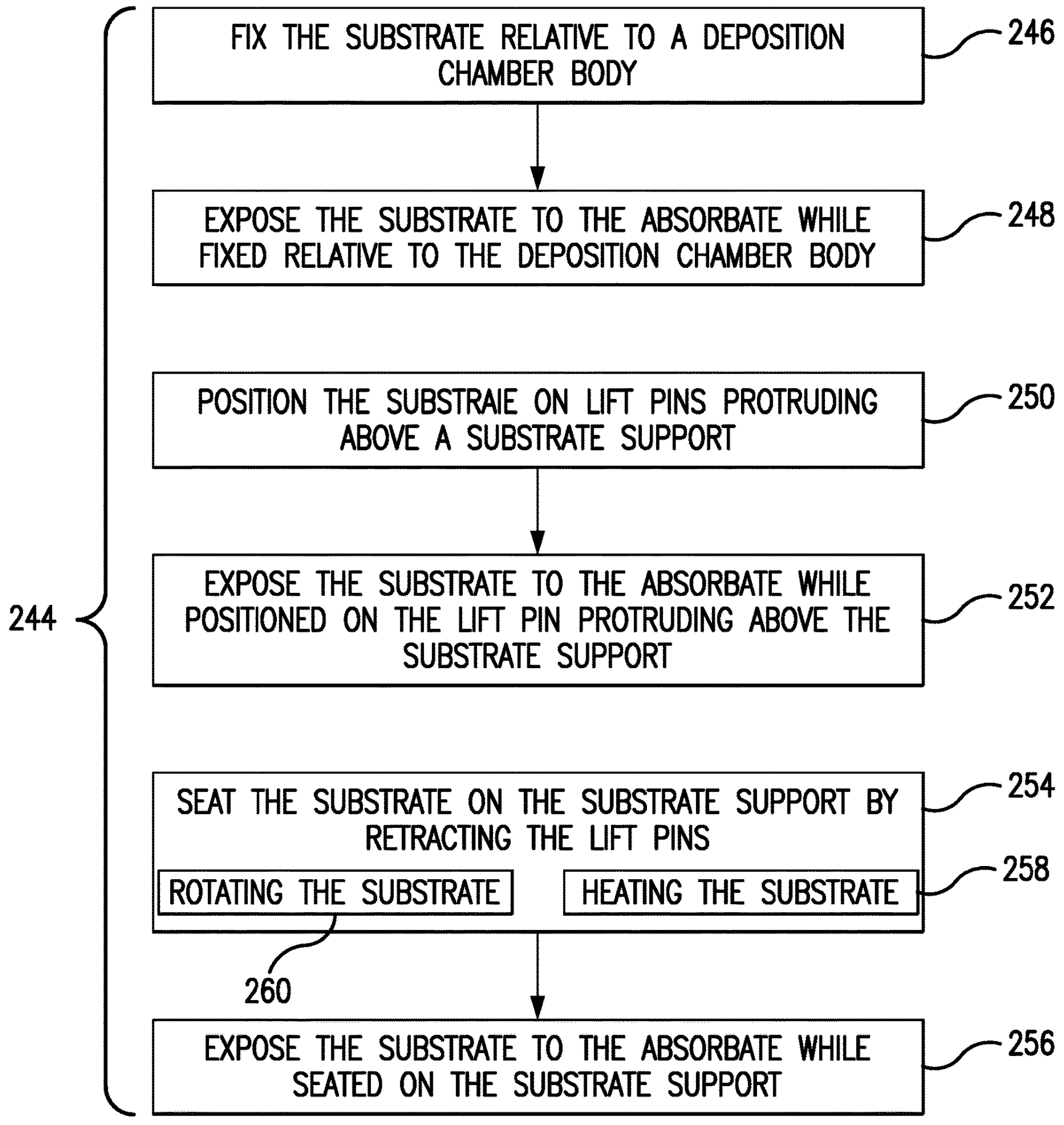
Figure 14:
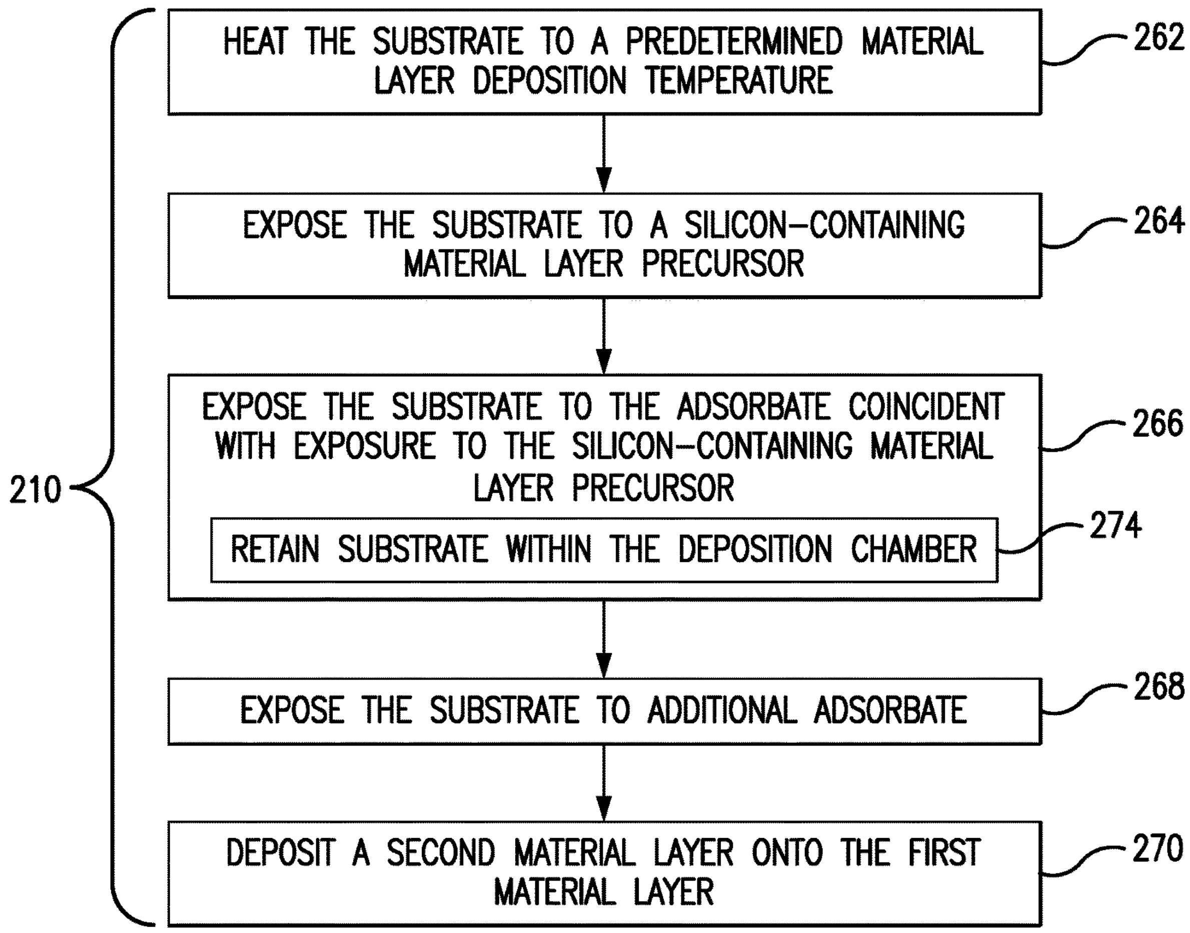

FIGS. 12 and 13 are block diagrams of a portion of the material layer deposition method of FIG. 9 according to an example, showing operations for exposing the substrate to an adsorbate prior to deposition of a material layer onto the substrate; and FIG. 14 is a block diagram of a portion of the material layer deposition method of FIG. 9 according to an example, showing operations for depositing a material layer onto the substrate subsequent to exposing the substrate to the adsorbate.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Figure 1:
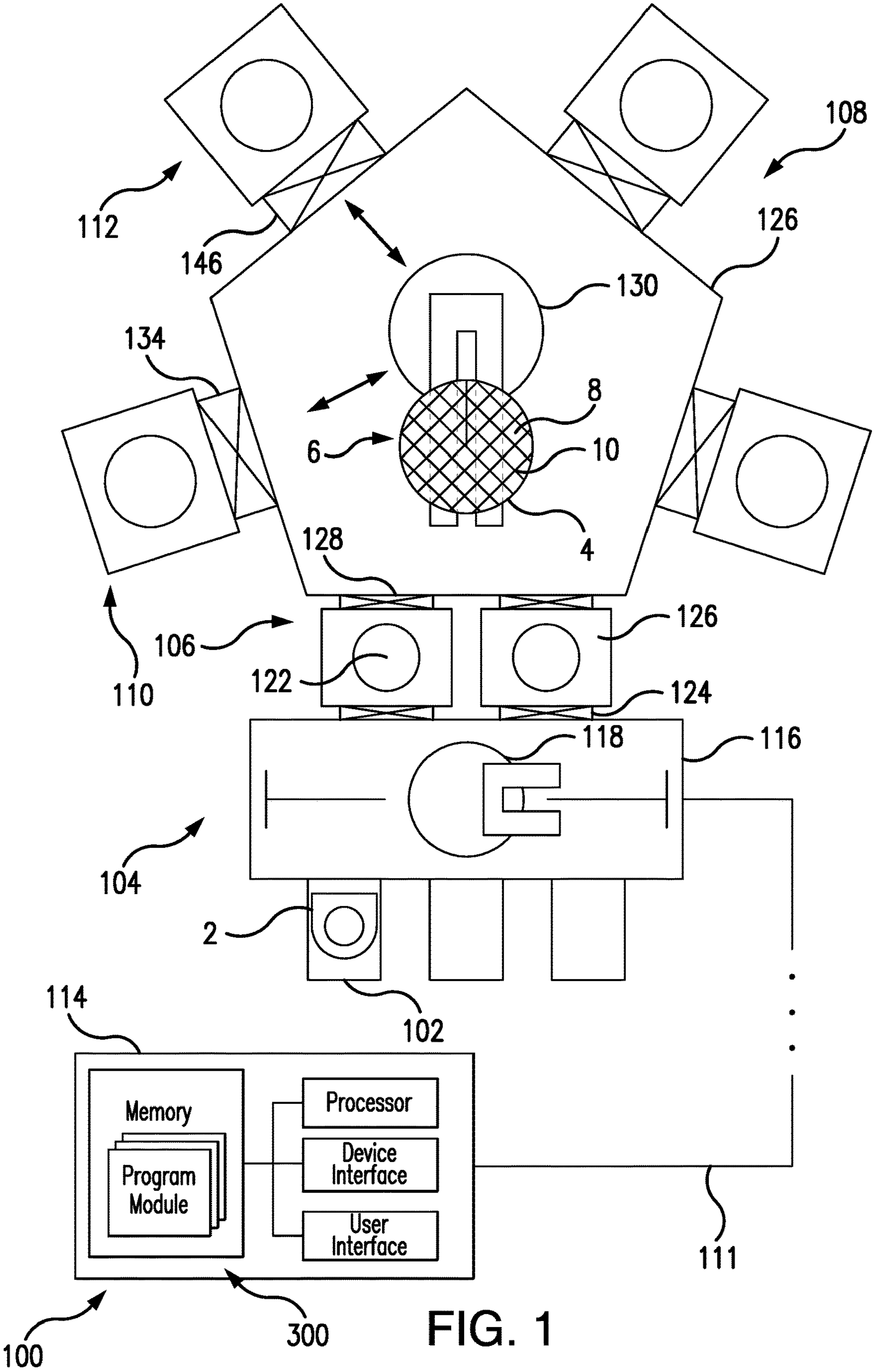
FIG. 1 is a plan view of the semiconductor processing system in accordance with the present disclosure, schematically showing a preclean module connected to a deposition module by a transfer module including a substrate transfer robot.

Reference will now be made to the drawings wherein like reference numerals identify similar structural features or aspects of the subject disclosure. For purposes of explanation and illustration, and not limitation, a partial view of an example of semiconductor processing system in accordance with the present disclosure is shown in FIG. 1 and is designated generally by reference character 100. Other examples of semiconductor processing systems, material layer deposition methods, and related computer program products in accordance with the present disclosure, or aspects thereof, are provided in FIGS. 2-14, as will be described. The systems and methods of the present disclosure may be used to deposit silicon-containing epitaxial material layers onto substrates without incorporating interfacial contaminants like oxygen between the material layer and the substrate, such as during the fabrication of source and drain structures for transistor devices in integrated circuits, though the present disclosure is not limited to material layers employed for source and drain structures or to any particular type of semiconductor device or device integration in general.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term “substrate” may refer to any underlying material or materials, including any underlying material or materials that may be modified, or upon which, a device, a circuit, or a film may be formed. The “substrate” may be continuous or non-continuous; rigid or flexible; solid or porous; and combinations thereof. The substrate may be in any form, such as a powder, a plate, or a workpiece. Substrates in the form of a plate may include wafers in various shapes and sizes, and may include 300-millimeter silicon wafers. Substrates may be made from semiconductor materials, including, for example, silicon, silicon germanium, silicon oxide, gallium arsenide, gallium nitride and silicon carbide. Substrates may be blanket-type substrates (e.g., without patterns) or may include patterns.

With reference to FIG. 1, the semiconductor processing system 100 is shown. The semiconductor processing system 100 may include a load port 102, a front-end module 104, and a load lock 106. The semiconductor processing system 100 may also include a transfer module 108, a preclean module 110, a deposition module 112, and a controller 114. Although shown and described herein as having a specific configuration, e.g., a cluster-type platform including four (4) process modules, it is to be understood and appreciated that the semiconductor processing system 100 can have different configurations in other examples of the present disclosure and remain within the scope of the present disclosure.

The load port 102 may be connected to the front-end module 104 and configured to seat thereon a pod 2 containing a substrate 4. In certain examples the substrate 4 may include a pattern 6 having a silicon surface portion 8 and a non-silicon surface portion 10, such as a dielectric or nitride surface portion. In accordance with certain examples, the substrate 4 may be a blanket-type substrate having no pattern. In the illustrated example the semiconductor processing system 100 has three (3) load ports. As will be appreciated by those of skill in the art in view of the present disclosure, the semiconductor processing system 100 may have fewer or additional load ports and remain within the scope of the present disclosure.

The front-end module 104 may be connected to the load port 102 and include an front-end enclosure 116 housing a front-end substrate transfer robot 118. The front-end substrate transfer robot 118 may be arranged within the front-end enclosure 116 and supported for movement within the enclosure relative to the load port 102. The front-end substrate transfer robot 118 may be further configured to transfer substrates, e.g., the substrate 4, between the load port 102 and the load lock 106.

The load lock 106 may be connected to the front-end module 104 and include load lock chamber 120, a transfer stage 122, and a front-end gate valve 124. The load lock chamber 120 may house the transfer stage 122 and be connected to the front-end enclosure 116 by the front-end gate valve 124. The transfer stage 122 may be configured to support one or more substrates, e.g., the substrate 4, during transfer between the front-end module 104 and the transfer module 108. The front-end gate valve 124 may couple the load lock chamber 120 to the front-end enclosure 116 and be configured to provide selective communication between the load lock chamber 120 and the front-end enclosure 116. In the illustrated example the semiconductor processing system 100 has two (2) load locks. As will be appreciated by those of skill in the art in view of the present disclosure, the semiconductor processing system 100 may have fewer or additional load locks and remain within the scope of the present disclosure.

Figure 2:
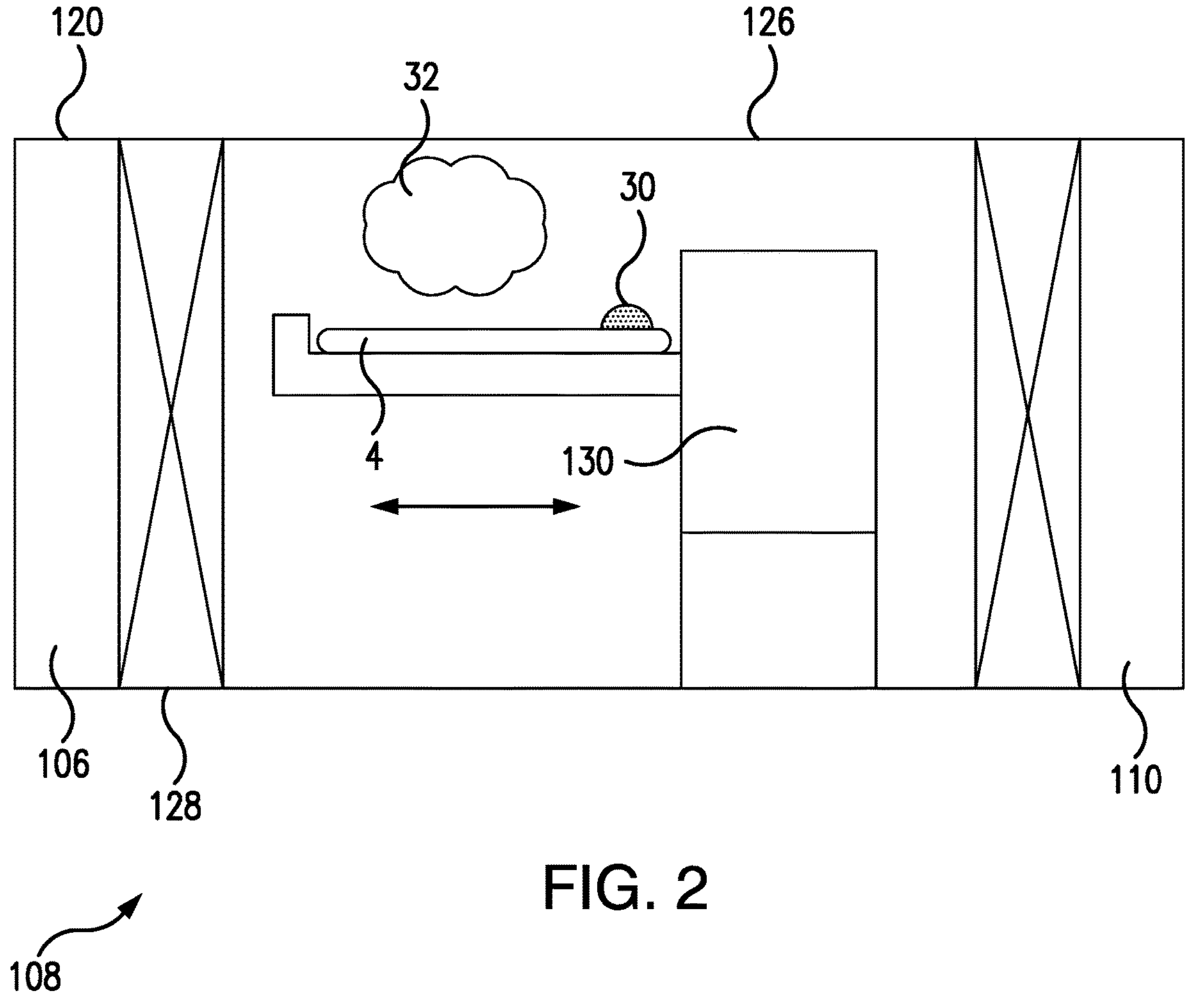
FIG. 2 is cross-sectional side view of the transfer module of FIG. 1 according to an example, schematically showing the substrate being transferred between the transfer module and the preclean module.

With reference to FIG. 2, the transfer module 108 may include a transfer chamber 126, a back-end gate valve 128, and a back-end substrate transfer robot 130. The transfer chamber 126 may house the back-end substrate transfer robot 130 and be connected to the load lock chamber 120 by the back-end gate valve 128. The back-end substrate transfer robot 130 may be configured to transfer substrates, e.g., the substrate 4, between the transfer stage 122 modules connected to the transfer module 108, e.g., the preclean module 110 and/or the deposition module 112. The back-end substrate transfer robot 130 may be further configured to transfer substrates between modules connected to the transfer chamber 126, e.g., the between the preclean module 110 and the deposition module 112 (shown in FIG. 1). The back-end gate valve 128 may couple the transfer chamber 126 to the load lock chamber 120 and be configured to provide selective communication between the transfer chamber 126 and the load lock chamber 120. Although shown and described herein as having a single transfer module 108 it is to be understood and appreciated that the semiconductor processing system 100 may have two or more transfer chambers and remain within the scope of the present disclosure.

Figure 3:
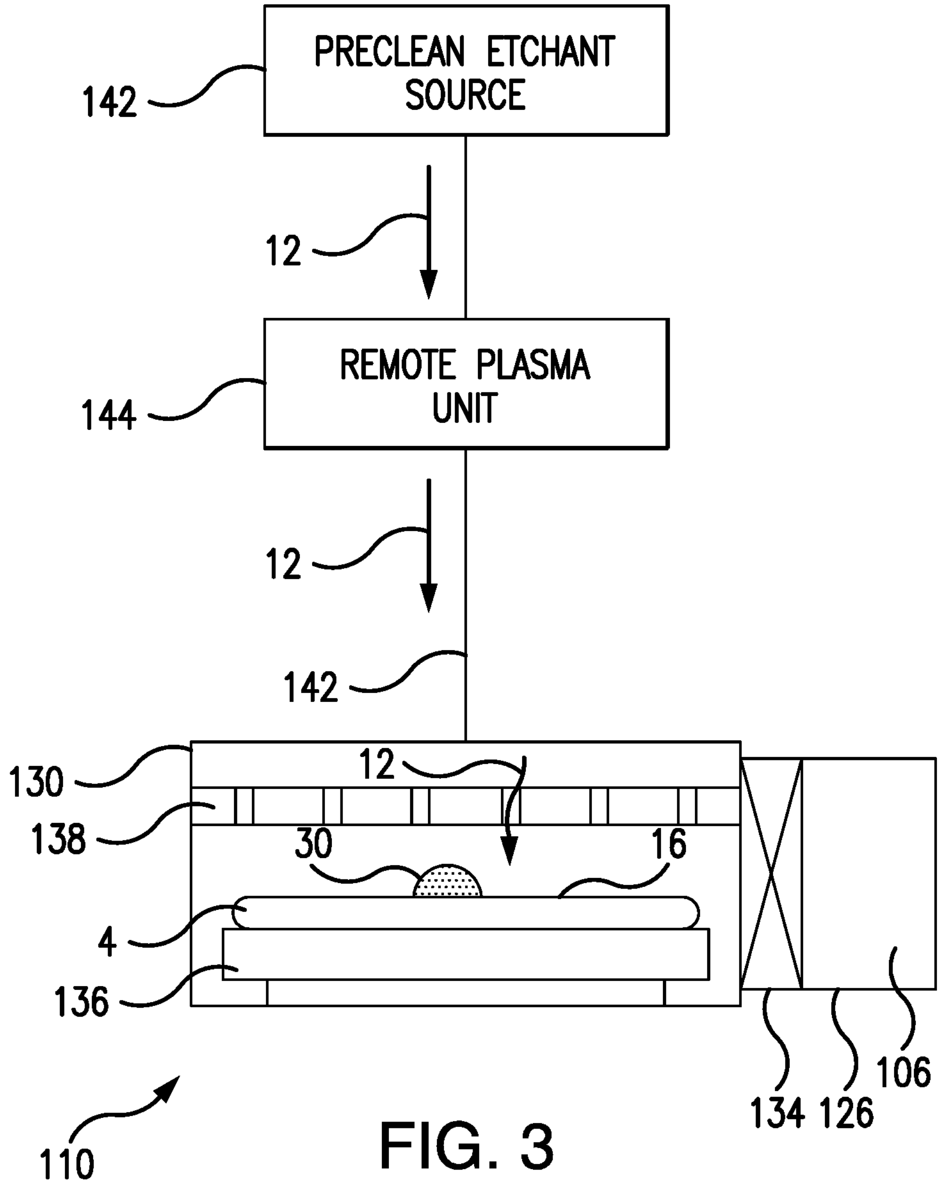
FIG. 3 is a cross-sectional side view of the preclean module of FIG. 1 according to an example, schematically showing a substrate supported within a preclean chamber below a showerhead and being precleaned using a preclean etchant communicated through the showerhead.

With reference to FIG. 3, the preclean module 110 may be configured to preclean substrates (e.g., the substrate 4) using a dry-etch technique. In this respect the preclean module 110 may be configured to remove an oxide (e.g., an oxide 30 bound to silicon forming the substrate 4) from the upper surface of the substrate 4, e.g., silicon surface portion 8 (shown in FIG. 1) of the pattern 6 (shown in FIG. 1) located on the substrate 4. In the illustrated example the preclean module includes a preclean chamber 132, a preclean gate valve 134, and a preclean stage 136. As shown and described herein the preclean module 110 also includes a showerhead 138, a transfer tube 140, and a preclean etchant source 142. As will be appreciated by those of skill in the art in view of the present disclosure, the preclean module 110 may have different arrangements in other examples and remain within the scope of the present disclosure.

The preclean chamber 132 houses the preclean stage 136 and is connected to the transfer chamber 126 by the preclean gate valve 134. The preclean gate valve 134 is configured to provide selective communication between the preclean chamber 132 and the transfer chamber 126 to transfer the substrate 4 between the preclean stage 136 and the deposition module 112 using the back-end substrate transfer robot 130. The preclean stage 136 is arranged within an interior of the preclean chamber 132 and is fluidly coupled to the transfer tube 140 by the showerhead 138. The showerhead 138 is fixed within the preclean chamber 132 between preclean stage 136 and the transfer tube 140 and is configured to communicate a preclean etchant 12 to the substrate 4 when seated on the preclean stage 136.

The transfer tube 140 connects the preclean etchant source 142 to the preclean chamber 132 and fluidly couples the preclean etchant source 142 therethrough to the preclean chamber 132. It is contemplated that the preclean etchant source 142 include the preclean etchant 12 and be configured to provide the preclean etchant 12 to the preclean chamber 132 through the transfer tube 140. The preclean etchant 12 be selected to remove the oxide 30 from the upper surface 16 of the substrate 4 chemically, for example, by breaking bonds between silicon and oxygen atoms in silicon oxide on the upper surface 16 of the substrate 4, e.g., on silicon surface portion 8 (shown in FIG. 1) of the pattern 6 (shown in FIG. 1). In certain examples, the preclean etchant 12 may include a fluorine-containing material.

In accordance with certain examples, the preclean etchant 12 may include hydrofluoric (HF) acid. In such examples the hydrofluoric acid may be generated in situ, e.g., at an upper surface 16 of the substrate 4, such as by communicating anhydrous hydrogen fluoride (aHF) and water ($H_2O$) vapor to the substrate 4, either in concert with one another or sequentially. It is also contemplated that the preclean etchant source 142 may be connected to the preclean chamber 132 by a remote plasma unit 144, and that the remote plasma unit 144 may communicate the preclean etchant 12 to the substrate 4 as one or more radical species.

Figure 4:
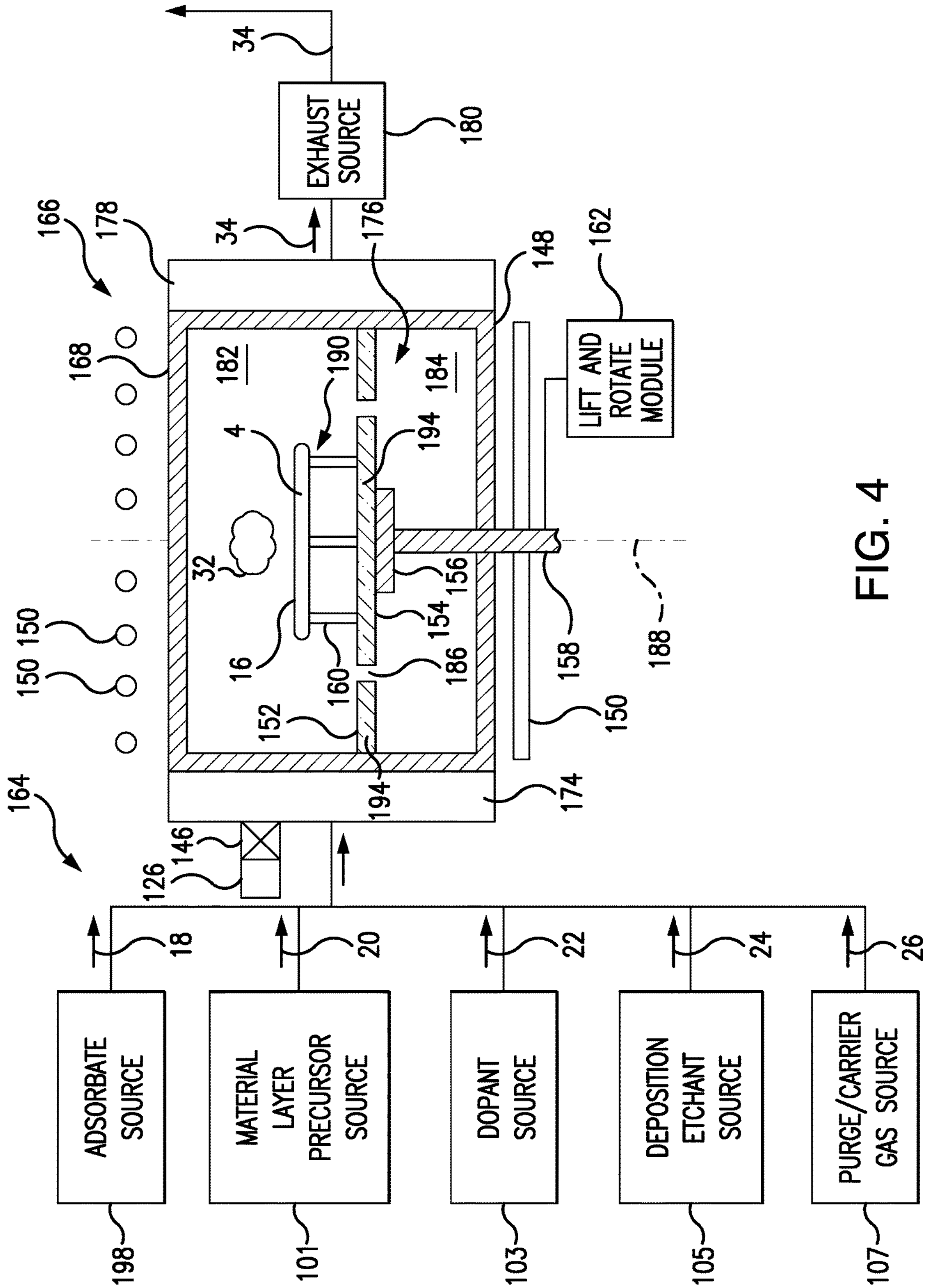
FIG. 4 is a cross-sectional side view of the deposition module of FIG. 1 according to an example, schematically showing precursor arrangement including an adsorbate source to passivate the substrate source an oxygen-containing species introduced into the deposition module during positioning of the substrate within the deposition module.

With reference to FIG. 4, the deposition module 112 may include a deposition gate valve 146, a deposition chamber 148, and a heater element array 150. The deposition module 112 may also include a divider 152, a substrate support 154, and a support member 156. The deposition module 112 may further include a shaft member 158, a plurality of lift pins 160, a lift and rotate module 162, and a precursor arrangement 164. The deposition chamber 148 is configured to support a substrate during deposition of a material layer onto the substrate, e.g., deposition of a material layer 14 (shown in FIG. 8) onto the substrate 4, and is coupled to the transfer chamber 126 by the deposition gate valve 146. The deposition gate valve 146 is configured to provide selective fluid communication between the transfer chamber 126 and the deposition chamber 148 such that that the back-end substrate transfer robot 130 (shown in FIG. 1) may position the substrate 4 on the lift pins 160 when protruding above the substrate support 154 prior to material layer deposition and retrieve the substrate 4 from the lift pins subsequent to deposition of the material layer 14.

The deposition chamber 148 includes a transparent body 166 formed at least partially from a transmissive material 168 and extends between an injection end 170 and a longitudinally opposite exhaust end 172. An injection flange 174 is connected to the injection end 170 of the transparent body 166, couples the deposition gate valve 146 to the transparent body 166, and fluidly couples the precursor arrangement 164 to an interior 176 of the transparent body 166. An exhaust flange 178 is connected to the exhaust end 172 of the transparent body 166, fluidly couples the interior 176 of the transparent body 166 to an exhaust source 180, and is configured to communicate residual precursor and/or reaction products 34 issued by the deposition module 112 during deposition of the material layer 14 (shown in FIG. 8) onto the substrate 4 to the external environment outside of the semiconductor processing system 100 (shown in FIG. 1). It is contemplated that the heater element array 150 include a plurality of lamps (e.g., linear lamps and/or spot-type lamps) supported outside of the transparent body 166, the lamps configured to radiantly heat the substrate 4 using infrared electromagnetic radiation communicated through the transmissive material 168. In certain examples, the transparent body 166 may have a flat upper and/or lower surface. In accordance with certain examples, the transparent body 166 may define arcuate profile and/or have a dome-like shape. It is also contemplated that, in accordance with certain examples, the transmissive material 168 forming the transparent body 166 may include a ceramic material, such as sapphire or quartz by way of non-limiting example.

The divider 152 is seated within the interior 176 of the transparent body 166, divides the interior 176 of the transparent body 166 into an upper chamber 182 and a lower chamber 184, and has an aperture 186 extending through the divider 152 and fluidly coupling the upper chamber 182 to the lower chamber 184. The substrate support 154 is supported for rotation R (shown in FIG. 7) about a rotation axis 188 within the aperture 186, slidably receives therein the lift pins 160 for movement between an extended position 190 and a retracted position 192 (shown in FIG. 5), and is configured to seat thereon the substrate 4 during deposition of the material layer 14 (shown in FIG. 8) thereon. The support member 156 is arranged within the lower chamber 184, is fixed in rotation R relative to the substrate support 154, and couples the substrate support 154 to the shaft member 158. The shaft member 158 extends through the lower wall of the transparent body 166, is fixed in rotation R relative to the support member 156, and operably connects the lift and rotate module 162 to the substrate support 154 to rotate the substrate support 154 about the rotation axis 188. In certain examples, the divider 152 may be formed from an opaque material 194, e.g., a material opaque to infrared electromagnetic radiation emitted by the heater element array 150, such as silicon carbide and/or a carbonaceous material such as graphite. In accordance with certain examples, the substrate support 154 may be formed from the opaque material 194. It is also contemplated that, in accordance with certain examples, that the lift and rotate module 162 may be operably connected to the a lift pin actuator 196 extending about the shaft member 158 to move the lift pins 160 between the retracted position 192 and the extended position 190. Examples of suitable lift pin actuators include those shown and described in U.S. Pat. No. 10,770,336 to Hill et al., issued on Sep. 8, 2020, the contents of which are incorporated herein by reference.

The precursor arrangement 164 is connected to the deposition module 112 and includes an adsorbate source 198 and a material layer precursor source 101. The precursor arrangement 164 may also include a dopant source 103, a deposition etchant source 105, and a purge or carrier gas source 107. The adsorbate source 198 is configured to provide an adsorbate 18 to the deposition module 112, which the deposition chamber 148 flows across the substrate 4 to expose the substrate 4 to the adsorbate 18. In certain examples, the adsorbate 18 may include (e.g., consist of or consist essentially of) an arsine-containing material. Examples of suitable arsine-containing materials include arsine ($AsH_3$). In accordance with certain examples, the adsorbate 18 may include (e.g., consist of or consist essentially of) a phosphorous-containing material. Examples of suitable phosphorous-containing materials include phosphine ($PH_3$). It is contemplated that the adsorbate 18 may include (e.g., consist or consist essentially of) an oxygenless compound having greater affinity to exposed silicon surfaces that oxygen-containing species such as water and oxygen gas, and that the greater affinity cause the adsorbate 18 to displace oxygen-containing species from the surface and/or passivate the exposed silicon surfaces by occupying surface locations otherwise available to oxygen-containing species resident the ambient environment of the substrate 4.

The material layer precursor source 101 is configured to provide a material layer precursor 20 to the deposition module 112, which the deposition chamber 148 flows across the substrate 4 to expose the substrate 4 to the material layer precursor 20 to deposit the material layer 14 (shown in FIG. 8) onto the substrate 4. The dopant source 103 is configured to provide a dopant-containing precursor 22 to the deposition, which the deposition chamber 148 may also flow across the substrate 4 to expose the substrate 4 to the dopant-containing precursor 22 during deposition of the material layer 14. The deposition etchant source 105 and the purge or carrier gas source 107 are similarly configured to provide a deposition etchant 24 and a purge or carrier gas 26, respectively, to the deposition chamber 148. It is contemplated that the deposition chamber 148 in turn flow the deposition etchant 24 and the purge or carrier gas 26 therethrough during deposition of the material layer 14 onto the substrate 4. In certain examples, the material layer precursor 20 may include a silicon-containing precursor, such as a silicon-containing material suitable for depositing an epitaxial silicon material layer onto the substrate 4. Examples of suitable silicon-containing precursors include silane ($SiH_3$) and dichlorosilane ($H_2SiCl_2$) by way of example. In accordance with certain examples, the dopant-containing precursor 22 may include an n-type or a p-type dopant, such as arsenic (As) or phosphorous (P) by way of example. It is contemplated that the deposition etchant 24 may include a halide-containing material such as hydrochloric acid (HCl), and that the purge or carrier gas 26 may include hydrogen $H_2$) gas or nitrogen ($N_2$) gas. It is also contemplated that, in certain examples, the adsorbate source 198 and the dopant source 103 may be a common source, and that whether the adsorbate 18 operates to displace oxygen-containing species from the upper surface 16 of the substrate or contribute a dopant to the developing material layer is determined by conditions within the deposition chamber 148, such as the presence or absence of the material layer precursor 20.

With continuing reference to FIG. 1, deposition of the material layer 14 (shown in FIG. 8) onto the substrate may be accomplished by transferring the substrate 4 to the preclean module 110. Once in the preclean module 110, the preclean module 110 provides the preclean etchant 12 to remove contaminant on the surface of the substrate 4 such as the oxide 30. The back-end substrate transfer robot 130 thereafter transfer the substrate 4 in a precleaned condition (e.g., the oxide 30 removed from the upper surface 16 of the substrate 4) to the deposition module 112. Once positioned within the deposition module 112 the substrate 4 is heated by the heater element array 150 (shown in FIG. 3) and exposed to the material layer precursor 20 (shown in FIG. 3) such that the material layer 14 (shown in FIG. 8) deposits onto the upper surface 16 of the substrate 4. The substrate 4 is thereafter removed from the deposition module 112, returned to the pod 2 through the transfer module 108 and the front-end module 104, and sent on for further processing, as appropriate for the semiconductor device being fabricated using the material layer 14.

Material layer deposition may be accomplished by the controller 114, which is operably connected to the modules of the semiconductor processing system 100 through a device interface 109 and a wired or wireless link 111. In the illustrated example the controller 114 includes a processor 113 connected to the device interface 109, a user interface 115 operably associated with the processor 113, and a memory 117 including a non-transitory machine readable medium having a plurality of program modules 119 recorded on the medium. The plurality of program modules 119 include instructions that, when read by the processor 113, cause the processor 113 to execute certain operations. Among the operations are operations of a method 200 (shown in FIG. 8), as will be described, the memory 117 and the plurality of program modules 119 in this respect forming a computer program product 300 with which the processor 113 may perform the method 200. Although shown and described herein as having a specific architecture it is to be understood and appreciated that the controller 114 may have other architectures in other examples, such as distributed architectures, and remain within the scope of the present disclosure.

As has been explained above, in some semiconductor processing systems, contaminants including an oxygen-containing material 32 (shown in FIG. 2) may infiltrate the transfer chamber 126 during operation. For example, oxygen-containing materials like water ($H_2O$) vapor and oxygen ($O_2$) may infiltrate the transfer chamber 126 during the transfer of substrates between the front-end module 104 and the transfer chamber 126. Residual etchant and/or etchant products materials may infiltrate the transfer chamber 126 as contaminants during the transfer of substrates between the preclean module 110 and the transfer chamber 126. And residual precursor and/or reaction products may infiltrate the transfer chamber 126 as contaminants during the transfer of substrates between the deposition module 112 and the transfer module 108.

Figure 5:
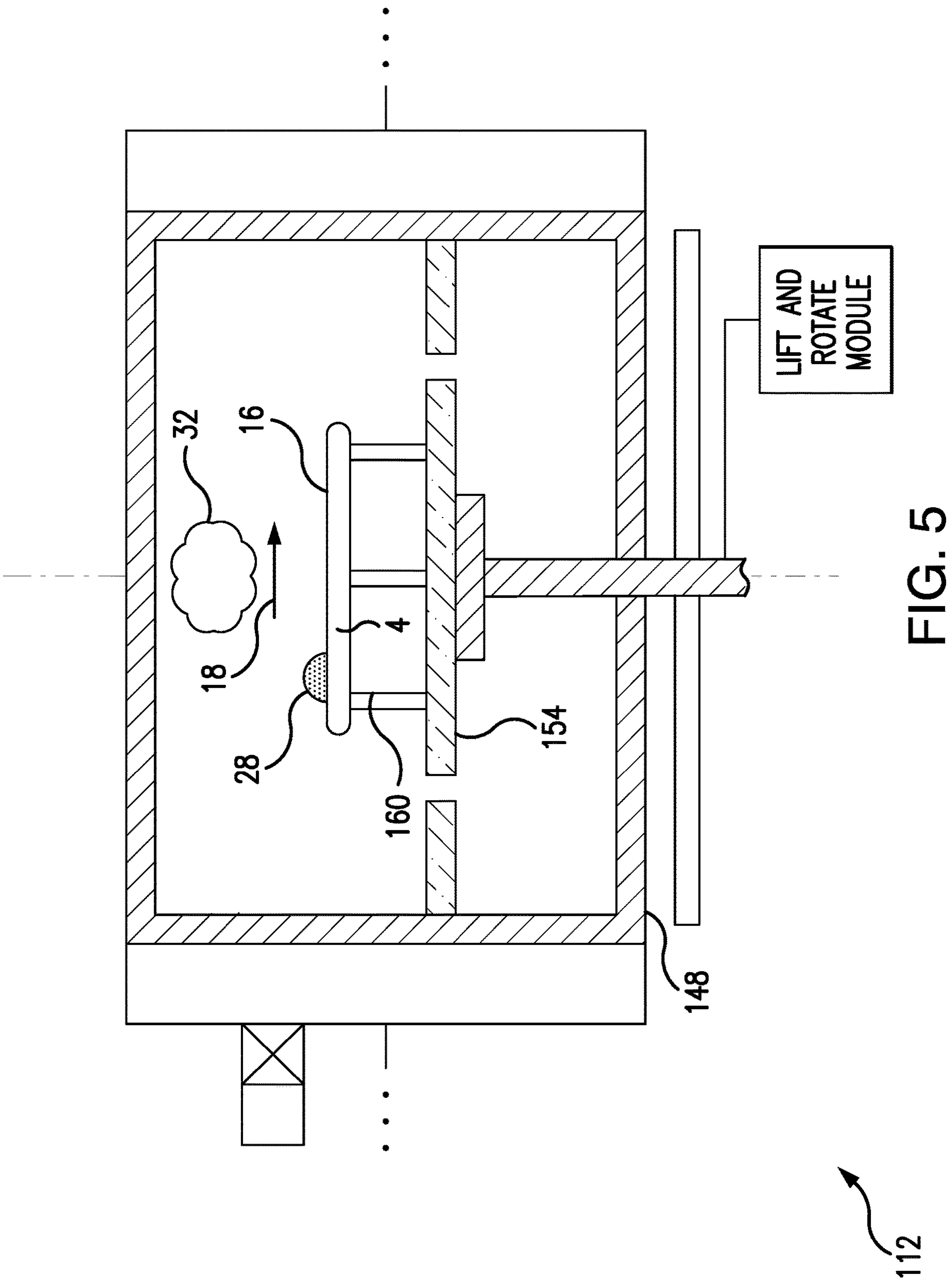
FIG. 5 is a cross-sectional side view of the deposition module of FIG. 1 according to an example of the present disclosure, schematically showing the substrate being exposed to adsorbate while positioned on lift pins and above a substrate support within the deposition module.

Once such contaminants enter the transfer chamber 126, the contaminants may attach to exposed silicon on the upper the surface 16 of the substrate 4 during transfer between the preclean module 110 and the deposition module 112, the substrate 4 thereby carrying a surface attached oxygen-containing species 28 (shown in FIG. 5). The contaminants may also (or alternatively) be communicated into the deposition module 112 during transfer of the substrate 4 into the deposition chamber 158. Once carried into the deposition chamber 158 by the substrate 4 (or communicated into the deposition chamber 158 with the substrate 4) the contaminants and/or oxygen-containing material may become resident (e.g., bound or unbound to exposed silicon atoms on upper surface 16 of the substrate 4) on the upper surface 16 of the substrate 4. To limit (or prevent) the incorporation of such contaminant an interfacial contaminant between the upper surface 14 of the substrate 4 and the material layer 14 (shown in FIG. 8), instructions recorded in the plurality of program modules 119 include operations to displace contaminants including oxygen-containing species from the upper surface 16 of the substrate 4 prior to deposition of the material layer 14 by exposing the substrate 4 to the adsorbate 18 prior to deposition of the material layer 14, as shown in FIGS. 5-7.

Referring to FIG. 5, the substrate 4 may exposed to the adsorbate 18 while fixed relative to the deposition chamber 148 and supported above the substrate support 154 on the plurality of lift pins 160. The adsorbate 18 may displace at least a portion of a surface attached oxygen-containing species 28 from the upper surface 16 of the substrate 4, for example, from the silicon surface portion 8 (shown in FIG. 1) of the pattern 6 (shown in FIG. 1). In this respect it is contemplated that the adsorbate 18 may preferential relative to an unbound oxygen-containing species resident on the upper surface 16 of the substrate 4, such as oxygen or moisture. Being preferential to the oxygen-containing species, the adsorbate displaces the oxygen-containing species, the oxygen-containing species thereby absent from the upper surface 16 of the substrate 4 at the start of deposition of the material layer 14 thereafter, the oxygen-containing species thereby not becoming incorporated between the material layer 14 and substrate 4 as interfacial oxygen. Alternatively (or additionally), the adsorbate 18 may compete with the oxygen-containing species 32 within the deposition chamber 148, passivating the upper surface 16 of the substrate 4 and limiting (or preventing) the oxygen-containing species 32 from attaching to the upper surface 16 of the substrate.

Figure 6:
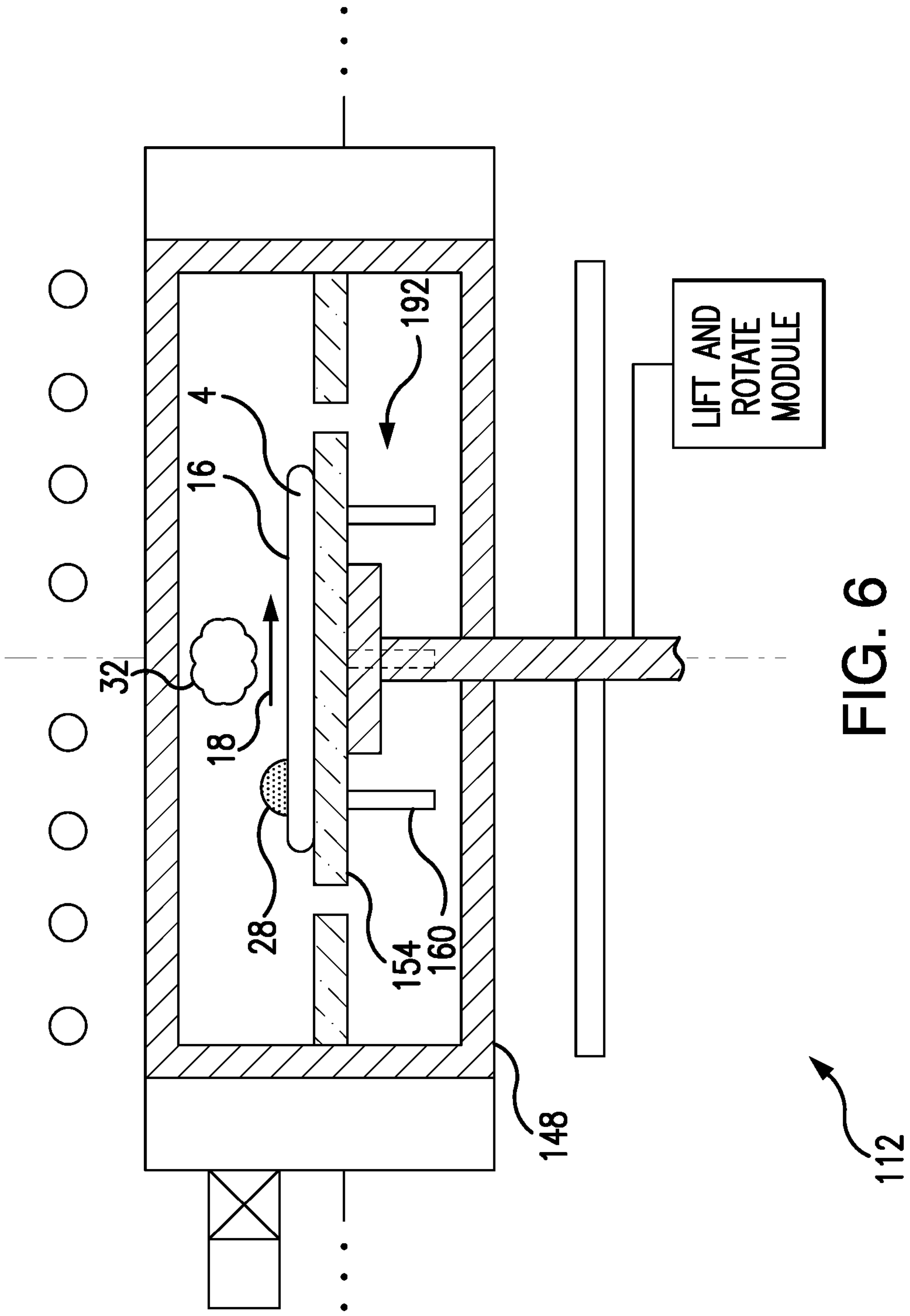
FIG. 6 is a cross-sectional side view of the deposition module of FIG. 1 according to an example of the present disclosure, schematically showing the substrate being exposed to adsorbate while seated on the substrate support within the deposition module.

Referring to FIG. 6, the substrate 4 may exposed to the adsorbate 18 while seated on the substrate support 154 and fixed relative to the deposition chamber 148, for example, by moving the plurality of lift pins 160 from the extended position (shown in FIG. 4) to the retracted position 192. The adsorbate 18 may displace at least a portion of the surface attached oxygen-containing species 28 from the upper surface 16 of the substrate 4, for example, from the silicon surface portion 8 (shown in FIG. 1) of the pattern 6 (shown in FIG. 1). Exposure to the adsorbate 18 while seated on the substrate support 154 may be done as an alternative to the exposure while positioned on the lift pins 160 or in addition to exposure while positioned on the lift pins 160. Alternatively (or additionally), the adsorbate 18 may compete with the oxygen-containing species 32 within the deposition chamber 148, passivating the upper surface 16 of the substrate 4 and limiting (or preventing) the oxygen-containing species 32 from attaching to the upper surface 16 of the substrate.

Figure 7:
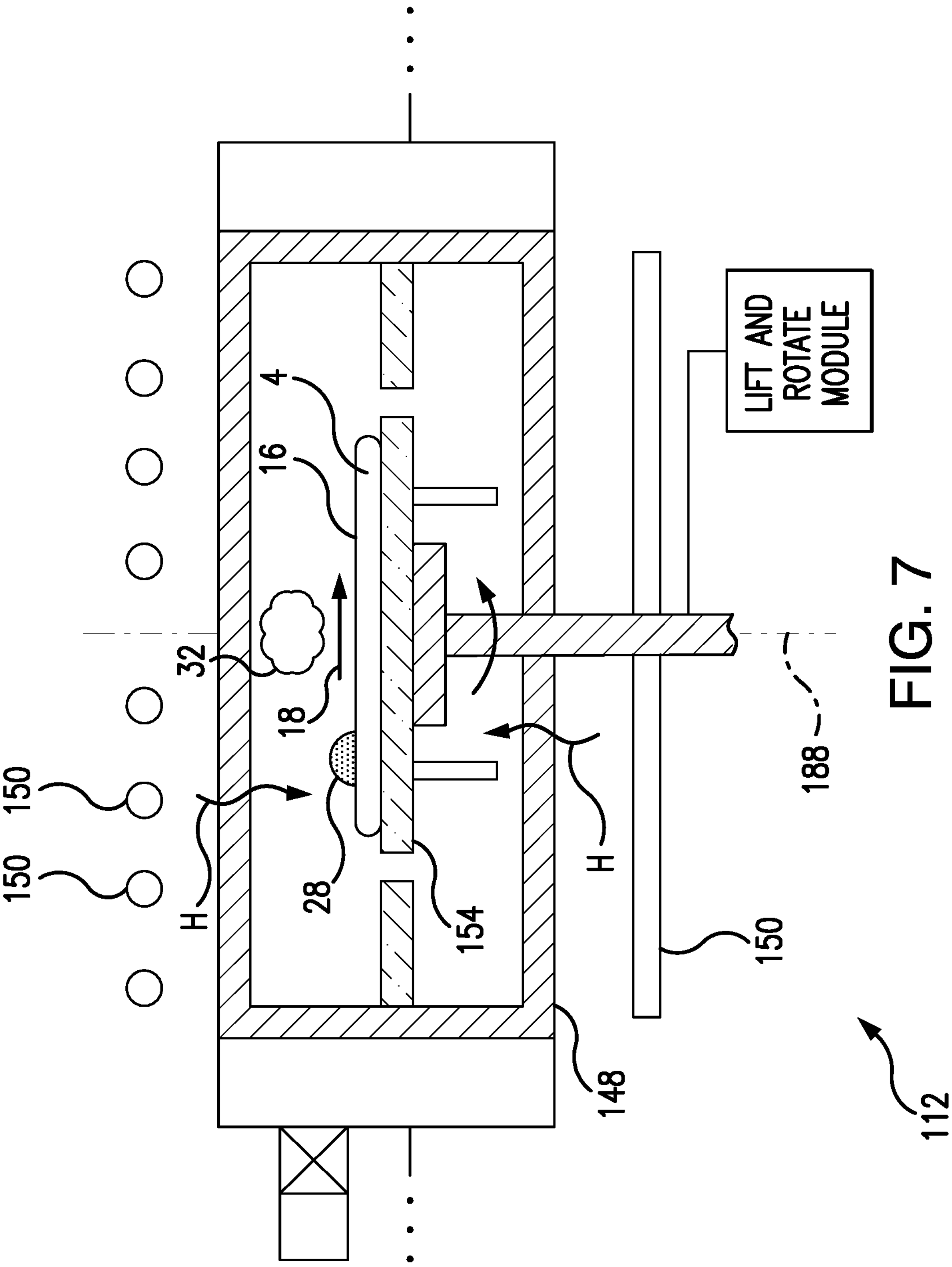
FIG. 7 is a cross-sectional side view of the deposition module of FIG. 1 according to an example of the present disclosure, schematically showing the substrate being exposed to adsorbate while being rotated and heated within the deposition module.

Referring to FIG. 7, the substrate 4 may exposed to the adsorbate 18 while rotating on the substrate support 154 relative to the deposition chamber 148, for example, when the lift and rotate module 162 is rotating R the substrate support 154 about the rotation axis 188. The adsorbate 18 may displace at least a portion of the surface attached oxygen-containing species 28 from the upper surface 16 of the substrate 4, for example, from the silicon surface portion 8 (shown in FIG. 1) of the pattern 6 (shown in FIG. 1). Exposure to the adsorbate 18 while the substrate support 154 may be done as an alternative to exposure to the adsorbate 18 while positioned on the lift pins 160 and/or while seated on the substrate support 154 and fixed relative to the deposition chamber 148. Exposure to the adsorbate 18 while rotating with the substrate support 154 may be done as an alternative to either (or both) exposure to the adsorbate 18 while positioned on the lift pins 160 and while seated on the substrate support 154 and fixed relative to the deposition chamber 148. Alternatively (or additionally), the adsorbate 18 may compete with the oxygen-containing species 32 within the deposition chamber 148, passivating the upper surface 16 of the substrate 4 and limiting (or preventing) the oxygen-containing species 32 from attaching to the upper surface 16 of the substrate.

Figure 8:
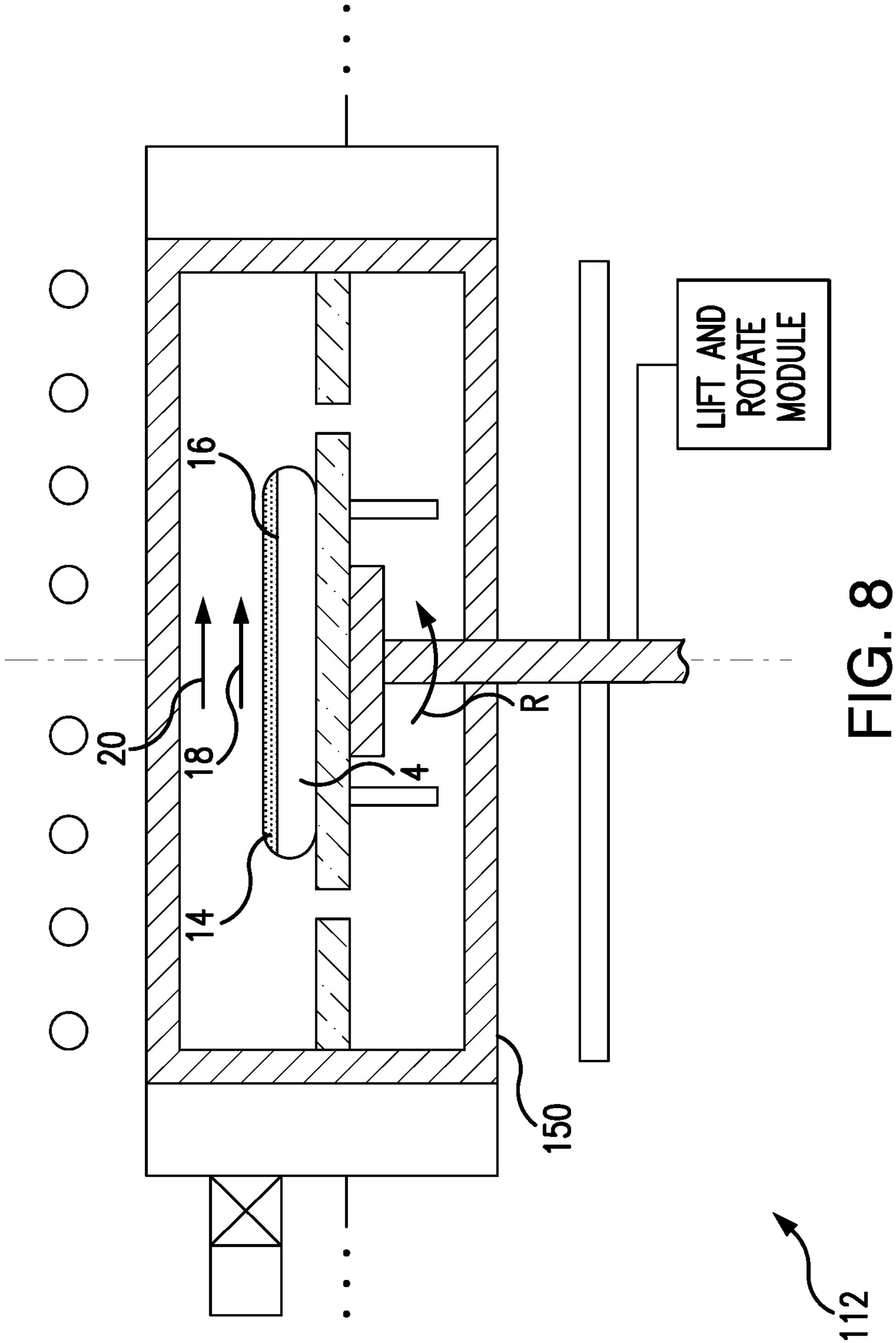
FIG. 8 is a cross-sectional side view of the deposition module of FIG. 1 according to an example, showing a material layer being deposited onto the upper surface of the substrate using a material layer precursor and the adsorbate as a dopant source.

With reference to FIG. 8, the material layer 14 may be deposited onto the substrate 4 subsequent to exposing the substrate 4 to the adsorbate 18. In certain examples, deposition of the material layer 14 onto the substrate 4, may include exposing the substrate to the adsorbate 18 in conjunction the exposing the substrate 4 to the material layer precursor 20. In this respect the adsorbate 18 may be employed as a dopant-containing precursor during deposition of the material layer 14 onto the substrate 4, such as by co-flowing the deposition etchant 24 to make dopant within the adsorbate 18 available for incorporation into the material layer 14 during deposition.

In certain examples, the substrate 4 may be exposed to an arsenic-containing material prior to provision of a material layer precursor to the substrate such that the arsenic-containing material displaces oxygen-containing specie from the upper surface 16 of the substrate 4, such as oxygen and/or moisture, and thereafter co-flowed with the material layer precursor such that arsenic contained within the arsenic-containing material is incorporated into the material layer 14. The substrate 4 may be exposed to a phosphorous-containing material prior to provision of a material layer precursor to the substrate such that the phosphorous-containing material displaces oxygen-containing specie from the upper surface 16 of the substrate 4, such as oxygen and/or moisture, and thereafter co-flowed with the material layer precursor such that phosphorous contained within the phosphorous-containing material is incorporated into the material layer 14.

With reference to FIGS. 9-14, the material layer deposition method 200 is shown. As shown in FIG. 9, the method 200 includes transferring a substrate into a preclean module, e.g., the substrate 4 (shown in FIG. 1) into the preclean module 110 (shown in FIG. 1), as shown with box 202. The method 200 also includes exposing the substrate to a etchant while supported within the preclean module, e.g., the preclean etchant 12 (shown in FIG. 3), as shown with box 204. The method 200 further includes transferring the substrate from the preclean module to a deposition module, e.g., the deposition module 112 (shown in FIG. 1), as shown with box 206. Once transferred into the deposition module the substrate is exposed to an adsorbate, e.g., the adsorbate 18 (shown in FIG. 4), as shown with box 208. Once exposed to the adsorbate, a material layer is deposited onto the substrate, e.g., the material layer 14 (shown in FIG. 8), as shown with box 210. In certain examples, the substrate may include a pattern having a silicon surface portion and a dielectric surface portion, e.g., the silicon surface portion 8 (shown in FIG. 1) and the non-silicon surface portion 10 (shown in FIG. 1), as shown with box 212. In accordance with certain examples, the substrate may be a blanket-type substrate having no pattern, as shown with box 214.

Supporting 202 the substrate within the preclean module may include supporting the substrate on a rotationally fixed substrate support. Supporting 202 the substrate within the preclean module may include supporting the substrate between a preclean substrate support and a showerhead, e.g., the preclean stage 136 (shown in FIG. 3) and the showerhead 138 (shown in FIG. 3). Supporting 202 the substrate within the preclean module may include fluidly coupling the substrate through the showerhead to an etchant source, e.g., the preclean etchant source 142 (shown in FIG. 3). Supporting 202 the substrate within the preclean module may include fluidly coupling the substrate to the etchant source through a remote plasma unit, e.g., the remote plasma unit 144 (shown in FIG. 3), to provide the first etchant to the substrate as a radical species through the showerhead.

Figure 10:
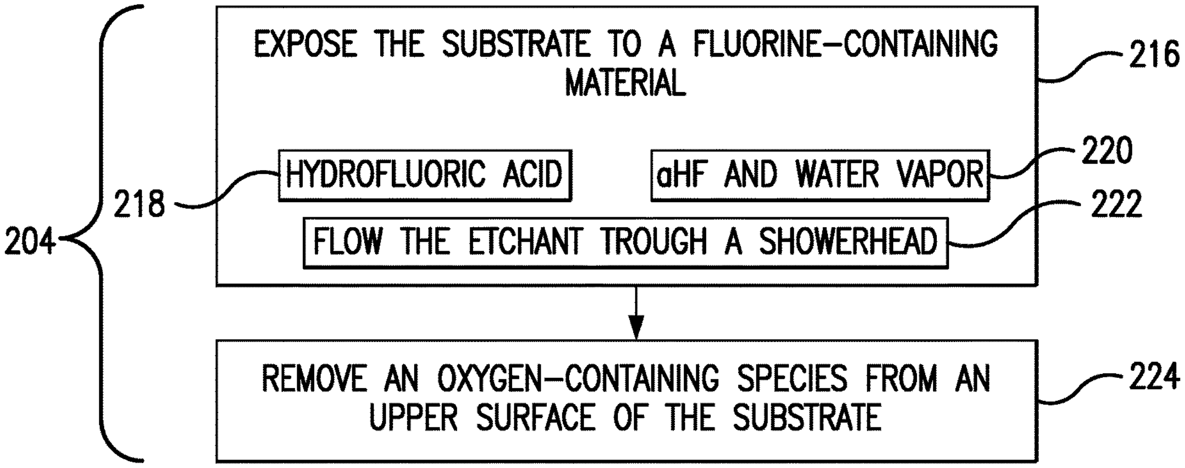
FIG. 10 is a block diagram of a portion of the material layer deposition method of FIG. 9 according to an example, showing operations for precleaning the substrate by exposing the substrate to an etchant.

As shown in FIG. 10, exposing 204 the substrate to the preclean etchant may include exposing the substrate to a fluorine-containing material, as shown with box 216. For example, fluorine radical species may be communicated to the substrate from the etchant source. Hydrofluoric (HF) acid may be communicated to the surface of the substrate, as shown with box 218. A hydrofluoric (HF) acid precursor may be communicated to the surface of the substrate, such as anhydrous hydrogen fluoride (aHF) and water vapor, as shown with box 220. The aHF and water vapor may be coincidently with one another to the substrate, for example, under temperature and pressure conditions under which hydrofluoric (HF) acid is not generated, as also shown with box 220. The aHF and water vapor may be sequentially communicated to the substrate, hydrofluoric acid being generated in-situ (e.g., at the surface of the substrate) using water adsorbed from the surface of the substrate. The preclean etchant may flowed through a showerhead fluidly coupling the substrate a preclean etchant source, e.g., the preclean etchant source 142 (shown in FIG. 3), as shown with box 222. It is contemplated that exposing 204 the substrate to the preclean etchant may include removing an oxygen-containing species (a bound species) from an upper surface of the substrate, e.g., the oxide 30 (shown in FIG. 2), as shown with box 224.

Figure 11:
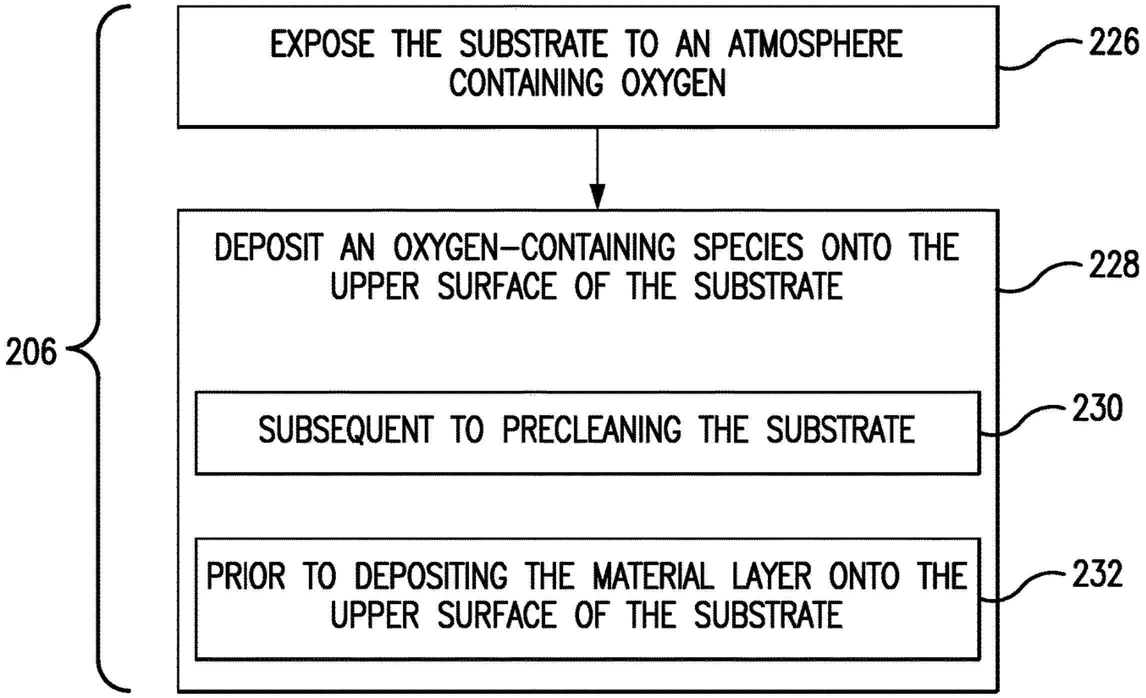
FIG. 11 is a block diagram of a portion of the material layer deposition method of FIG. 9 according to an example, showing operations for transferring the precleaned substrate into a deposition module through a contaminated atmosphere.

As shown in FIG. 11, transferring 206 the substrate from the preclean module to the deposition module may include exposing the substrate to a contaminant resident within the interior of the transfer body, as shown with box 226. Transferring the substrate from the preclean module to the deposition module may include depositing an oxygen-containing species consequent to exposure of the substrate to an oxygen-containing material within an atmosphere within the transfer chamber and/or communicating the oxygen-containing species into the deposition module with the substrate, for example onto the silicon surface portion of the substrate, as shown with box 228. Therewith (or therein), the oxygen-containing species may be deposited and become resident (e.g., unbound or weakly bound due to affinity between the silicon surface and oxygen-containing species)

subsequent to precleaning the substrate, as shown with box 230. The oxygen-containing species may be deposited onto the substrate prior depositing a material layer onto the substrate, for example, prior to depositing the material layer onto the substrate, as shown with box 232. The oxygen-containing species may be deposited onto the substrate without unloading the substrate from the semiconductor processing system, for example, without transferring the substrate to the load lock 106 (shown in FIG. 1) subsequent to being precleaned in the preclean module and prior to deposition of a material layer onto the substrate in a deposition module.

As shown in FIG. 12, exposing 208 the substrate to the adsorbate may include exposing the substrate to a dopant-containing material, e.g., a dopant-containing material subsequently employed during the depositing 210 of the material layer onto the substrate, as shown with box 234. Exposing 208 the substrate to the adsorbate may be include exposing the substrate to an adsorbate including (e.g., consisting of or consisting essentially of) an arsenic-containing material, as shown with box 236. Exposing 208 the substrate to the adsorbate may include exposing the substrate an adsorbate including (e.g., consisting of or consisting essentially of) a phosphorous-containing material, as shown with box 238. In certain examples, the arsenic-containing material may include (e.g., consist of or consist essentially of) arsine ($AsH_3$), as shown with box 240. In accordance with certain examples, the phosphorous-containing material may include (e.g., consist of or consist essentially of) phosphine ($PH_3$), as shown with box 242. It is contemplated that, in accordance with certain examples, that the adsorbate displace an oxygen-containing species resident on the upper surface of the substrate, for example, on the silicon portion of the pattern included on the substrate, as shown with box 244.

As shown in FIG. 13, displacing 244 the oxygen-containing species with the adsorbate may include supporting the substrate within a deposition chamber, e.g., the deposition chamber 148 (shown in FIG. 4), and fixing the substrate relative to the deposition chamber body, as shown with box 246. The substrate may be exposed to the adsorbate while fixed relative to the deposition chamber body, as shown with box 248. Displacing 244 the oxygen-containing species with the adsorbate may include positioning the substrate on a plurality of lift pins protruding above a substrate support, e.g., the plurality of lift pins 160 (shown in FIG. 4) protruding above the substrate support 154 (shown in FIG. 4), as shown with box 250.

In certain examples, the substrate may be exposed to the adsorbate wile positioned on the plurality of lift pins protruding above the substrate support, as shown with box 252. Displacing 244 the oxygen-containing species from the substrate may include seating the substrate on the substrate support by retracting the lift pins through the substrate support, as shown with box 254. The substrate may be exposed to the adsorbate while seated on the substrate support, as shown with box 256. In accordance with certain examples, the substrate may be heated while seated on the substrate support and exposed to the adsorbate, such as during ramping to a predetermined deposition temperature, as shown with box 258. It is also contemplated that, in accordance with certain examples, the substrate may be rotated by the substrate support while exposed to the adsorbate, as shown with box 260.

As shown in FIG. 14, depositing 210 the material layer onto the substrate may include heating the substrate to a predetermined deposition temperature, for example using the heater element array 150 (shown in FIG. 4), as shown with box 262. Depositing 210 the material layer onto the substrate may include exposing the substrate to a silicon-containing material included in a material layer precursor, e.g., the material layer precursor 20 (shown in FIG. 4), as shown with box 264. Depositing 210 the material layer onto the substrate may include exposing the substrate to additional adsorbate, for example, under conditions that cause the adsorbate to contribute a dopant to a silicon-containing material layer deposited onto the substrate, as shown with box 266. As shown with box 268 and box 270, the substrate may thereafter be exposed to a additional adsorbate and a second material layer thereafter deposited on the material layer, such as in examples where the material layer is a low resistivity material layer formed of n-EPI and the second layer a barrier layer, as shown with box 272. It is contemplated that the substrate may be retained within the deposition module between deposition of the first material layer and the second material layer, as shown with box 274.

Deposition of epitaxial material layers may be influenced by the chemical state and/or roughness of the surface upon which the material layer is grown. For example, oxygen-containing species resident on the surface of a substrate in densities one the order of $1e^{13}$ atoms per square centimeter may disrupt deposition of some epitaxial layers, potentially altering electrical properties of the material layer. And while pre-deposition bakes and/or surface precleaning may be employed to desorb oxygen-containing species prior to material layer deposition, baking may be limited to thermal sensitivity of certain types of substrates, such as patterned substrates, and precleaned substrates may acquire additional oxygen-containing species prior to deposition during transfer between the preclean module where precleaning occurs and the deposition module wherein material layer deposition occurs. Without being limited to a particular theory or mode of operation, it is believed that oxidation of the substrate surface may occur during transfer of a precleaned substrate into a deposition module due to intermixing of gases resident within the deposition module and the substrate transfer module coupling the deposition module to the preclean module.

In examples described herein the surface of a substrate may be passivated using an adsorbate prior to deposition of a material layer onto the substrate to impede adsorption of oxygen-containing species (e.g., oxides) resident on the surface of the substrate. In certain examples, the adsorbate may have a chemistry similar to that of the material layer deposited onto the substrate, for example, the adsorbate molecule having an atom identical to an atom employed as a dopant in the material layer deposited onto the substrate. In this respect the substrate may be exposed to an adsorbate include arsenic, and the material layer subsequently deposited onto the substrate may include arsenic, such as by using arsine ($AsH_3$) as both adsorbate and as a dopant-containing material provided during deposition of the material layer onto the substrate. In further respect, the substrate may be exposed to an adsorbate including phosphorous prior to deposition of the material layer onto the substrate, and substrate thereafter exposed to a dopant-containing material including phosphorous during deposition of the material layer onto the substrate, such as by using phosphine ($PH_3$) as both adsorbate and as a dopant-containing material provided during deposition of the material layer onto the substrate.

Advantageously, experimentation by the applicant shows that material layer deposition techniques employing adsorbate exposure prior to material layer deposition may limit interfacial oxide incorporation between the substrate and an epitaxial material layer deposited on the surface of the substrate. Experimentation by the application also shows that adsorbate exposure prior to deposition of so-called barrier material layers onto epitaxial material layers may limit (or eliminate entirely) oxide regrowth during stabilization in deposition operations where films stacks are deposited onto substrates. To further advantage, exposing the substrate (or material layer) to an adsorbate prior to material layer deposition may sharpen material layer transition, e.g., by increasing dopant or alloying constituent concentration at the interface of the material layer with the underlying material layer or substrate. And in examples where arsine ($AsH_3$) is employed as the adsorbate, incorporated arsenic atoms may occupy surface sites on the substrate (or material layer on to which another material layer is to be deposited) previously available to oxygen adsorbates, blocking such oxygen adsorbates from access to such surface sites and effectively displacing such oxygen adsorbates from surface sites on the substrate or material layer onto another material layer is to be deposited.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases. The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A material layer deposition method, comprising:

supporting a substrate in a preclean module;

performing, in the preclean module, a first precleaning of the substrate by exposing the substrate to a preclean etchant;

transferring the substrate from the preclean module into a deposition module;

supporting the substrate in the deposition module;

performing, in the deposition module, a second precleaning of the substrate by exposing the substrate to an adsorbate to passivate a surface of the substrate, and wherein the adsorbate comprises at least one of an arsenic-containing material and a phosphorous-containing material; and after performing the second precleaning, depositing, in the deposition module, a material layer onto the substrate.

2. The method of claim 1, wherein performing the first precleaning comprises:

exposing the substrate to a fluorine-containing material provided through a showerhead while the substrate is fixed relative to the showerhead; and removing an oxygen-containing species from an upper surface of the substrate using the fluorine-containing material.

3. The method of claim 1, wherein the transferring the substrate further comprises:

exposing the substrate to an atmosphere containing an oxygen-containing species such that the oxygen-containing species is deposited onto an upper surface of the substrate prior to supporting the substrate within the deposition module; or communicating the oxygen-containing species into the deposition module.

4. The method of claim 1, wherein the adsorbate comprises a dopant-containing material, and wherein exposing the substrate to the adsorbate to passivate the surface of the substrate increases an amount of dopant-containing material at an interface of the material layer with the material layer deposited onto the substrate.

5. The method of claim 1, wherein the adsorbate comprises at least one of arsine ($AsH_3$) and phosphine ($PH_3$).

6. The method of claim 1, wherein transferring the substrate from the preclean module to the deposition module comprises surface attaching an oxygen-containing species onto an upper surface of the substrate, and wherein performing the second precleaning comprises removing the surface attached oxygen-containing species from the upper surface of the substrate using the adsorbate.

7. The method of claim 1, wherein supporting the substrate in the deposition module comprises fixing the substrate relative to a deposition chamber body, and wherein performing the second precleaning comprises performing the second precleaning while the substrate is fixed relative to the deposition chamber body.

8. The method of claim 7, wherein supporting the substrate in the deposition module comprises positioning the substrate on a plurality of lift pins protruding above a substrate support supported for rotation about a rotation axis within the deposition module, and wherein performing the second precleaning comprises performing the second precleaning while the substrate is positioned on the plurality of lift pins and above the substrate support.

9. The method of claim 7, wherein supporting the substrate in the deposition module comprises seating the substrate on a substrate support by retracting a plurality of lift pins through the substrate support, and wherein performing the second precleaning comprises performing the second precleaning while the substrate is seated on the substrate support and rotatably fixed relative to the deposition module.

10. The method of claim 7, wherein supporting the substrate in the deposition module comprises rotating the substrate and the substrate about a rotation axis, and wherein performing the second precleaning comprises performing the second precleaning while the substrate is rotating about the rotation axis.

11. The method of claim 7, wherein supporting the substrate in the deposition module comprises heating the substrate to a predetermined material layer deposition temperature, and wherein performing the second precleaning comprises performing the second precleaning during the heating the substrate to the predetermined material layer deposition temperature.

12. The method of claim 7, wherein depositing the material layer onto the substrate further comprises rotating the substrate about a rotation axis, and wherein depositing the material layer onto the substrate comprises exposing the substrate to additional adsorbate under conditions that cause the additional adsorbate to contribute a dopant to the material layer.

13. The method of claim 1, wherein depositing the material layer comprises:

heating the substrate to a predetermined material layer deposition temperature;

exposing the substrate to a silicon-containing material layer precursor; and exposing the substrate to additional adsorbate, wherein the additional adsorbate contributes a dopant to the material layer during deposition of the material layer onto the substrate.

14. The method of claim 1, wherein the substrate is retained within the deposition module between performing the second precleaning and depositing the material layer onto the substrate.

15. A computer program product, comprising:

a non-transitory machine-readable medium having a plurality of program modules recorded thereon with instructions that, when read by a processor, cause the processor to:

support a substrate in a preclean module of a semiconductor processing system;

perform, in the preclean module, a first precleaning of the substrate by exposing the substrate to a preclean etchant;

transfer the substrate from the preclean module to a deposition module of the semiconductor processing system through a transfer chamber of the semiconductor processing system;

support the substrate in the deposition module;

perform, in the deposition module, a second precleaning of the substrate by exposing the substrate to an adsorbate to passivate a surface of the substrate, wherein the adsorbate comprises at least one of an arsenic-containing material and a phosphorous-containing material; and after performing the second precleaning, deposit a material layer onto the substrate while supported within the deposition module.

16. The method of claim 1, wherein performing the first precleaning comprises removing first oxygen-containing species from an upper surface of the substrate; and wherein performing the second precleaning comprises blocking a second oxygen-containing species from the upper surface of the substrate.

17. The method of claim 1, wherein passivating the surface of the substrate limits oxide incorporation between the substrate and the material layer.

18. The method of claim 1, wherein passivating the substrate limits oxide regrowth during a stabilization process associated with depositing the material layer onto the substrate.

19. The method of claim 1, further comprising:

causing, based on exposing the substrate to the adsorbate to passivate the surface of the substrate, occupation of surface sites associated with the surface of the substrate, wherein the surface sites were previously available to oxygen adsorbates.

20. The method of claim 1, further comprising:

blocking, based on exposing the substrate to the adsorbate to passivate the surface of the substrate and during deposition of the material layer onto the substrate, oxygen adsorbates from surface sites associated with the surface of the substrate.

* * * * *